United States Patent [19]
Kolsrud

[11] Patent Number: 6,130,590
[45] Date of Patent: Oct. 10, 2000

[54] PROGRAMMABLE FILTER BANK HAVING NOTCH FILTER AND BANDPASS FILTER FREQUENCY RESPONSES

[75] Inventor: Arild Kolsrud, Bridgewater, N.J.

[73] Assignee: Lucent Technologies Inc., Murray Hill, N.J.

[21] Appl. No.: 09/134,051

[22] Filed: Aug. 14, 1998

[51] Int. Cl.$^7$ ................................................ H03H 7/01
[52] U.S. Cl. ................................................ 333/174; 333/175
[58] Field of Search ........................... 333/173, 174, 333/188, 189, 193, 202, 205, 207, 101, 175

[56] References Cited

U.S. PATENT DOCUMENTS

| | | | |
|---|---|---|---|
| 3,671,889 | 6/1972 | Favors | 333/175 X |
| 3,855,556 | 12/1974 | Hartmann | 333/193 |
| 4,763,089 | 8/1988 | Pon | 333/202 |
| 4,970,479 | 11/1990 | Landt et al. | 333/202 X |
| 5,428,814 | 6/1995 | Mort et al. | 333/101 X |
| 5,515,017 | 5/1996 | Yamada et al. | 333/207 |

*Primary Examiner*—Benny Lee
*Assistant Examiner*—Barbara Summons

[57] ABSTRACT

An inexpensive to produce and small profile programmable filter bank with a high quality factor that applies an adjustable frequency response to an input signal to produce a filtered output signal. In a preferred embodiment, the programmable filter bank includes an input for receiving the input signal, an output for transmitting the filtered output signal and a set of interconnected individually selectable filter elements, where each filter element provides a predefined fixed frequency response. A control unit, such as a digital state machine or a microprocessor is connected to the filter elements and enables a user to select one or more filter elements in order to generate a desired overall frequency response, for application to the input signal, that is formed of the combination of the frequency responses of the selected filter element(s).

11 Claims, 4 Drawing Sheets

PROGRAMMABLE FILTER BANK HAVING NOTCH FILTER AND BANDPASS FILTER FREQUENCY RESPONSES

BACKGROUND OF THE INVENTION

1. Field of the Invention

The present invention relates generally to the field of signal processing and, in particular, to a programmable filter apparatus for applying a frequency response to an input signal to produce a filtered output signal.

2. Description of the Related Art

Filters of various types and configurations are commonly used components in most signal processing applications. A typical filter is designed to apply a fixed frequency response to an input signal to produce a different filtered output signal. Traditionally, a filter is implemented as a discrete element or component on a circuit board of an electronic device. Since a filter contributes to the functionality and operational characteristics of the electronic device, if the functionality and/or characteristics of the electronic device need to be changed then the filter installed in the electronic device may need to be replaced with another filter having a different desirable frequency response.

Replacement of a filter often involves manually detaching the filter from the circuit board of the electronic device and then soldering, or otherwise attaching the replacement filter, while taking care not to damage the filters or other device components. Thus, replacement of an installed filter is an undesirable, time consuming and challenging task that may result in damage to installed or replacement filters or to other device components.

To address this problem, tunable variable frequency filters have been developed. A tunable filter may be adjusted to vary its frequency response within a predefined frequency response range. Thus, if the functionality or operational characteristics of the electronic device are to be changed, the tunable filter may be adjusted as needed or appropriate to provide the desired new frequency response for the electronic device. However, tunable filters have several significant disadvantages. First, these are relatively bulky and are thus difficult to position and install on circuit boards of most electronic devices, where space is often at a premium. The size of tunable filters makes them unusable in many signal processing applications which require compact or miniaturized circuitry. Second, tunable filters are much more expensive than their fixed frequency counterparts. Finally, tunable filters have a lower Q-factor (quality factor) than fixed frequency filters.

Thus, it would be desirable to provide a small-sized, inexpensive programmable filter having an adjustable frequency response and having a high quality factor comparable to that of fixed frequency filters.

SUMMARY OF THE INVENTION

The present invention provides an inexpensive to produce and small profile programmable filter bank having an adjustable frequency response and a high quality factor. The filter bank of the present invention includes an input for receiving an input signal, an output for transmitting a filtered output signal and a set of interconnected individually selectable filter elements, where each filter element provides a predefined fixed frequency response. A control unit, such as a digital state machine or a microprocessor, is connected to the filter elements and enables a user to select one or more filter elements in order to generate a desired overall frequency response for application to the input signal and that is composed of a combination of the frequency responses of the selected filter element(s). The filter elements are preferably quartz crystal filters, but may be implemented as ceramic or dielectric resonators as a matter of design choice. Quartz crystal filters are generally superior to other filter types because of their electrical properties and small size.

The filter elements may be of contiguous resonance frequencies so that, when several filter elements are selected in order, they provide a contiguous overall frequency response. Alternately, the filter elements may have non-contiguous resonance frequencies; in this case when several non-contiguous filter elements are selected, the overall frequency response may have a "notch" or a missing response area. The selection of contiguous and non-contiguous resonance frequencies for the filter elements is a matter of design choice.

In one embodiment of the invention the filter bank includes a network of columns of wires and a network of substantially perpendicular rows of wires, where both wire networks are connected to the control unit. Each filter element is provided with two leads, with one lead connected to one of the column wires and the other lead connected to one of the row wires. The user may select particular filter elements by causing the control unit to energize particular combinations of column and row wires that are connected to the leads of the particular filter elements to be selected. Alternately, the control unit may be implemented as a series of column wire switches connected to the column wires and row wire switches connected to the row wires so that various row and column switches may be individually activated by a user to select the desired filter element(s). Optionally, a programmable state control unit may be connected to the column and row switches to enable the user to program predetermined switch settings that activate one or more predefined filter element combinations.

In order to prevent the user from selecting undesirable combinations of filter elements, the control unit is preferably supplied with a list of "illegal" combinations that will not be selected, even if the user attempts to do so. An optional variable gain amplifier may also be connected to the filter bank to ensure constant signal strength at the output.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DESCRIPTION OF THE DRAWINGS

In the drawings, wherein like reference characters denote corresponding or similar elements throughout the various figures.

DETAILED DESCRIPTION OF THE CURRENTLY PREFERRED EMBODIMENTS

The apparatus of the present invention is described herein with reference to common electronic components such as filter elements digital state machines, switches, and amplifiers that are well known in the art. Accordingly, the construction of the various electronic components of the invention need not be discussed in detail and such components will be described only with respect to their functionality.

Figure 1:
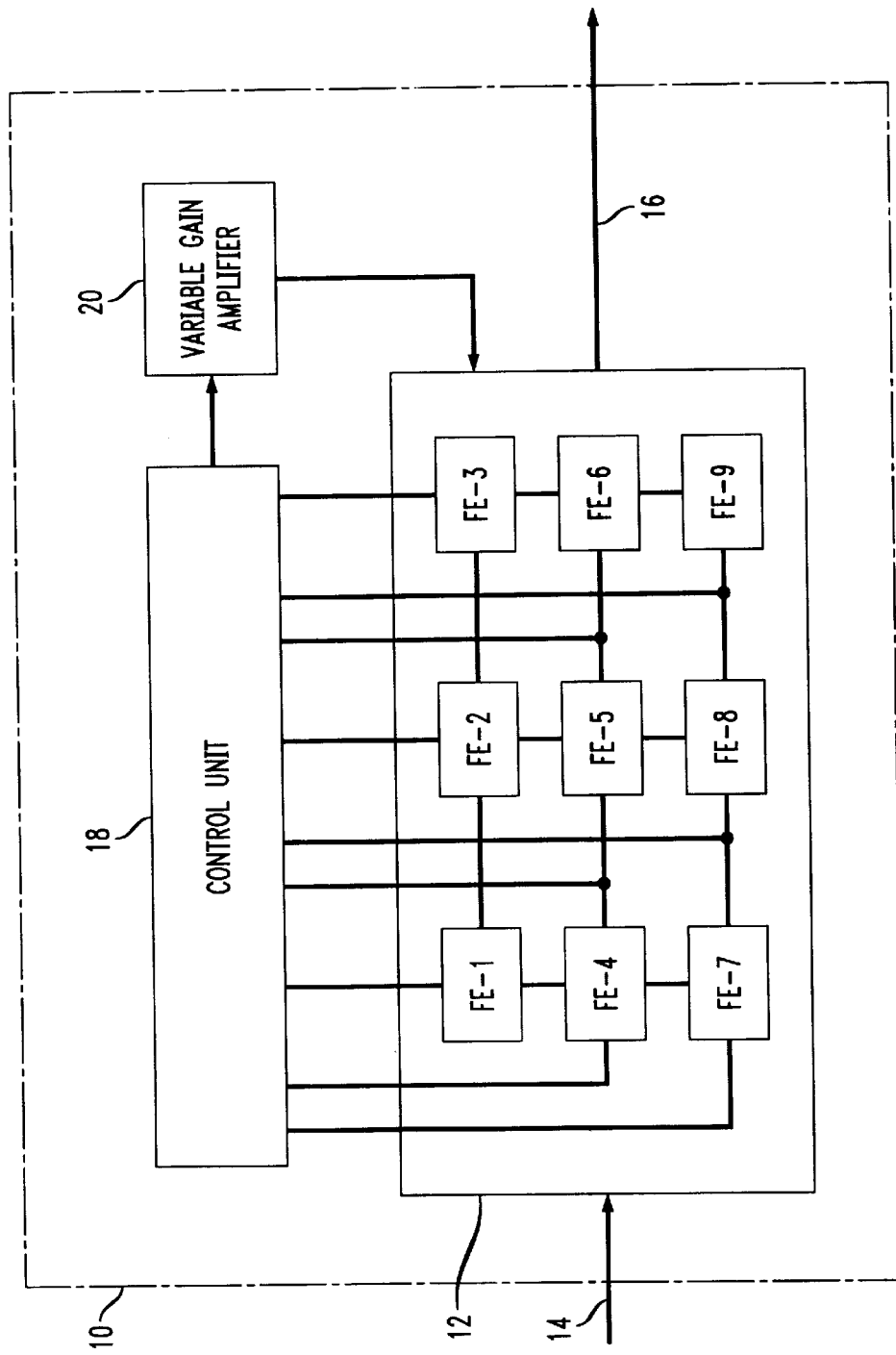
FIG. 1 is a schematic block diagram of a programmable filter bank having a set of selectable individual filter elements in accordance with the present invention.

Referring now to the drawings, FIG. 1 depicts a programmable filter bank 10 having an input line 14 and an output line 16 for applying a selectable frequency response to an input signal received through the input line 14 to produce a filtered output signal at the output line 16. The filter bank 10 includes a filter element set 12, having a group of interconnected selectable individual filter elements FE-1 through FE-9, for generating a selectable frequency response for application to the input signal received via the input line 14. Each individual filter element FE-1 through FE-9 provides a predefined fixed frequency response. The filter elements FE-1 to FE-9 are preferably quartz crystal filters. Quartz crystal filters are advantageous due to their small size, low loss, narrow bandwidth, and high quality factor. Alternately, other types of filters, such as ceramic or dielectric resonators, may be used, but at low frequencies the quartz crystal's electrical properties are superior in comparison. Furthermore, at lower frequencies, ceramic and dielectric resonators are significantly bulkier than quartz crystals of comparable frequencies and thus increase the size of the filter bank 10.

Figure 6:
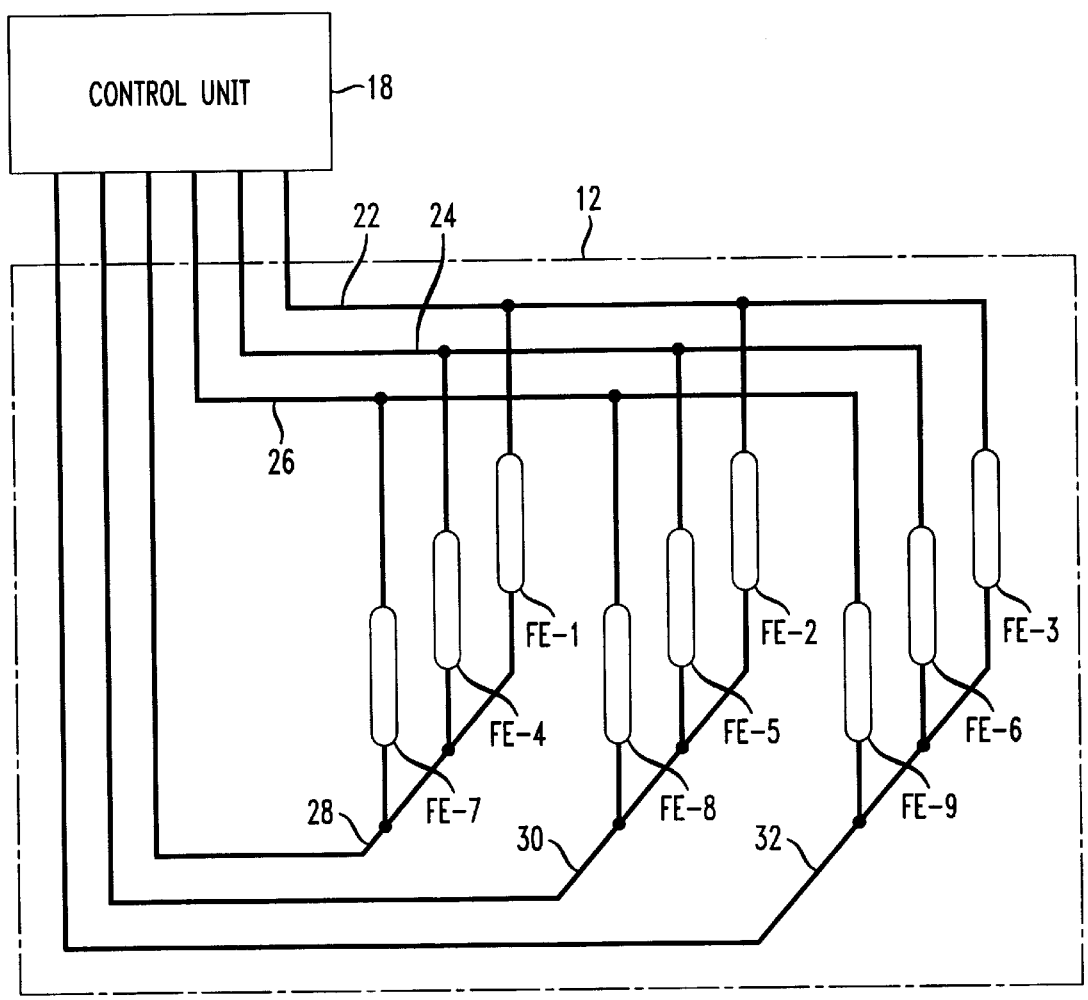
FIG. 6 is a three-dimensional view of an exemplary embodiment of the programmable filter bank of FIG. 1.
Figure 7:
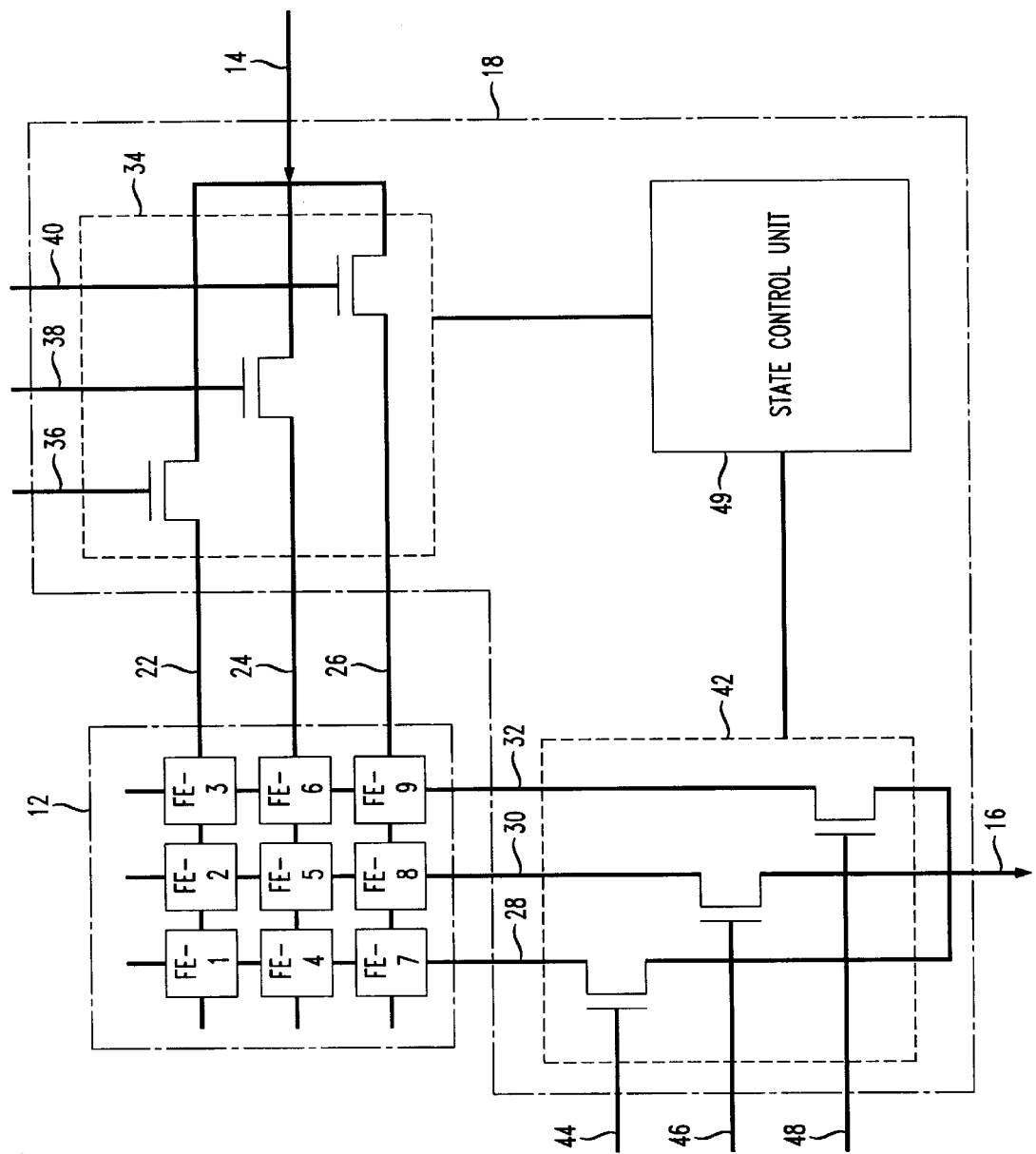
FIG. 7 is a schematic diagram of an embodiment of the programmable filter bank of FIG. 6 utilizing row and column switch matrices in accordance with the present invention.

While only nine filter elements are shown in FIGS. 1 and 6–7, it should be understood that other quantities of filter elements may be readily used as a general matter of design choice. The particular number of filter elements in filter element set 12 is only limited by the physical size of the filter bank 10 and by the desired range of the overall frequency response of the filter.

A control unit 18, such as a digital state machine or a microprocessor, is connected to the filter elements FE1 to FE-9 for enabling a user to select one or more of the filter elements in order to generate a desired overall frequency response for the filter element set 12 that is composed of a combination of the frequency responses of the selected filter element(s). Thus, the user may utilize the control unit 18 to select one, two, or any number of filter elements from the filter element set 12 and thereby combine their individual frequency responses to produce a desired overall frequency response which may then be applied to the input signal by control unit 18 to produce a filtered output signal with desirable characteristics. Optionally, the user may program the control unit 18 to select particular filter element combinations in response to predefined user settings. For example, a bandpass filter setting may cause the control unit 18 to select all filter elements FE-1 to FE-9. In essence, the filter bank 10 may be configured to emulate a narrow-band, a bandpass, or any other type of filter by programming the control unit 18 to select particular arrangements of filter elements corresponding to the various filter types.

An optional variable gain amplifier 20, controlled by the control unit 18, may be connected to the filter element set 12 to ensure that the input signal remains at constant strength as it is filtered and routed to the output line 16.

Figure 2:
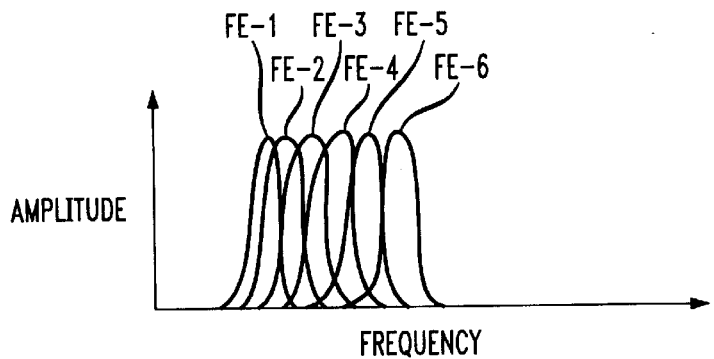
FIG. 2 is an exemplary frequency diagram illustrating individual filter element responses for filter elements of the programmable filter bank of FIG. 1 selected in a contiguous frequency arrangement.
Figure 3:
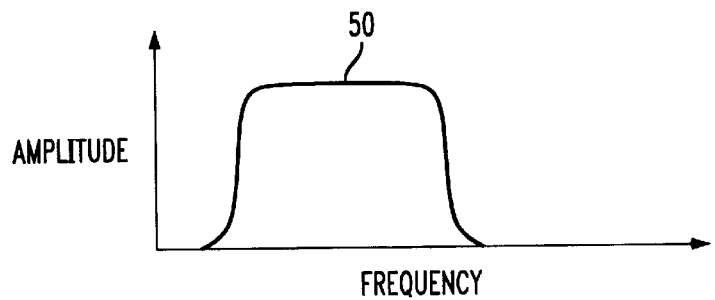
FIG. 3 is an exemplary frequency diagram illustrating an overall frequency response for the filter elements of the programmable filter bank of FIG. 1 selected in the contiguous frequency arrangement shown in FIG. 2.

The filter elements FE-1 to FE-9 may be of contiguous resonance frequencies so that, when several filter elements are selected in sequential order, they provide a contiguous overall frequency response. FIG. 2 depicts an exemplary frequency diagram showing individual frequency responses (i.e., resonant frequencies) of contiguous frequency filter elements FE-1 through FE-6 selected by the control unit 18. FIG. 3 depicts an overall frequency response 50 for the selected contiguous frequency filter elements FE-1 to FE-6. The overall frequency response of selected contiguous filter elements enables the filter bank 10 to be used as a bandpass filter.

Figure 4:
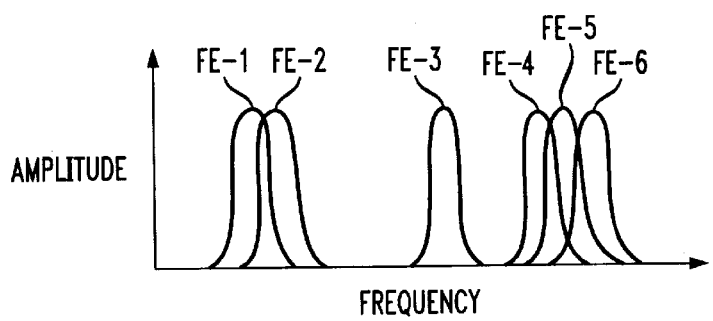
FIG. 4 is an exemplary frequency diagram illustrating individual filter element responses for filter elements of the programmable filter bank of FIG. 1 selected in a noncontiguous frequency arrangement.
Figure 5:
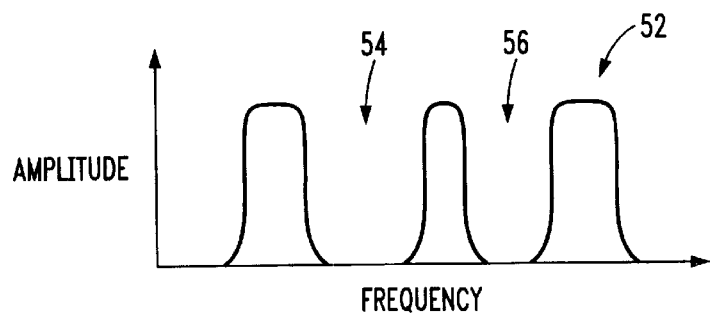
FIG. 5 is an exemplary frequency diagram illustrating an overall frequency response for the filter elements of the programmable filter bank of FIG. 1 selected in the non-contiguous frequency arrangement shown in FIG. 4.

Alternately, the filter elements may have non-contiguous resonance frequencies. In this case, when several filter elements are selected, the overall frequency response may have a "notch" or a missing response area. FIG. 4 depicts an exemplary frequency diagram showing individual frequency responses (i.e., resonant frequencies) of non-contiguous frequency filter elements FE-1 through FE-6 selected by the control unit 18. FIG. 5 depicts an overall frequency response 52 for the selected non-contiguous frequency filter elements FE-1 to FE-6 with two "notches" 54 and 56. The overall frequency response of selected non-contiguous filter elements enables the filter bank 10 to be used as a notch filter. Thus, the selection of contiguous and non-contiguous resonance frequencies for the filter elements is a matter of design choice, i.e. whether bandpass or notch filter characteristics are desired.

The process by which the control unit 18 selects one or more filter elements from the filter element set 12 may be implemented in a number of ways known in the art. Referring to FIG. 6, in one exemplary embodiment of the invention the filter element set 12 includes column wires 22, 24, and 26 connected to the control unit 18 and also includes row wires 28, 30, and 32, also connected to control unit 18. Each filter element FE-1 to FE-9 is provided with two leads, with one lead connected to one of the column wires 22, 24 or 26 and the other lead connected to one of the row wires 28, 30 or 32. For example, filter element FE-1 is connected to column wire 26 and row wire 28, while filter element FE-5 is connected to column wire 24 and row wire 30.

The user may select particular filter elements by causing the control unit 18 to activate particular combinations of column and row wires that are connected to the leads of the particular filter elements to be selected. For example, if filter element FE-5 is to be selected, then the user instructs the control unit 18 to activate column wire 24 and row wire 30, thus selecting filter element FE-5. In another example, if filter elements FE-1, FE-3, FE-4 and FE-6 are to be selected, then the user instructs the control unit 18 to activate column wires 22 and 24 and row wires 28 and 32 to select the desired filter elements.

While the exemplary embodiment of the filter bank 10 of FIG. 6 is shown as a three-dimensional matrix, it should be understood that any other matrix configuration can be utilized as a matter of design choice or convenience. In addition, the positioning of the leads on each filter element may be determined as a matter of component and/or design choice. For example, both the first and second leads can extend from one portion or end of the filter.

In order to prevent the selection of certain filter element combinations, the control unit 18 may include a list of "illegal" combinations such that when a user attempts to select a combination of filter elements that appears in the list of "illegal" combinations, the user's selection attempt is blocked by the control unit 18. Preferably, the list of "illegal" states is documented by the manufacturer of the programmable filter bank 10 so that the user is given advance notice of forbidden filter element combinations.

Referring now to FIG. 7, the control unit 18 of the embodiment of FIG. 6 may alternately be implemented as a series of column wire switches 36, 38, and 40 arranged in a column switch matrix 34 and connected to the column wires 22, 24, and 26, respectively, and a series of row wire switches 44. 46, and 48 arranged in a row switch matrix 42 and connected to the row wires 28, 30, and 32, respectively. Various row and column switches may be actuated by the user to activate particular combinations of row and column wires and thus to select desired filter elements in a manner that is described above in connection with FIG. 6. Alternately, instead of manual actuation by the user, the column switch matrix 34 and the row switch matrix 42 may be digitally controlled by a state control unit 49, such as a solid state electronic circuit or an analog mechanism, in accordance with program instructions provided by the user.

The filter bank 10 of the present invention is advantageous because by controlling the selection of filter elements via the control unit 18, the user is able to configure the filter bank 10 to emulate a variety of filters at various overall frequency response ranges. Thus, if the functionality and/or operational characteristics of the electronic device, in which the filter bank 10 is installed, need to be changed, then the user may merely re-program the filter bank 10 to a different frequency response and/or filter characteristic rather than replacing it, as is necessary with previously known filters. Furthermore, because of the miniature size of the filter elements, the filter bank 10 has a very small profile that facilitates its incorporation into microcircuits such as a dual-in-line package (DIP). Finally, since the individual filter elements are of very low cost, the filter bank 10 is much less expensive and thus a superior alternative to tunable filters.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example., it is expressly intended that all combinations of those elements which perform substantially the same function in substantially the same way to achieve the same results are within the scope of the invention. It is the intention, therefore, to be limited only as indicated by the scope of the claims appended hereto.

I claim:

1. A programmable filter bank for filtering a received input signal to produce a filtered output signal, comprising:

a plurality of selectable interconnected filter elements, each said filter element having a predefined resonance frequency, and said plural filter elements being arranged in a non-contiguous frequency sequence;

a selector connected to each of said plural filter elements and operable to select at least one filter element of said plurality of filter elements to receive said input signal and produce a desired overall frequency response as a predefined function of said resonance frequency of said selected at least one filter element;

a controller for applying said overall frequency response to the input signal to produce the filtered output signal;

a first controller configuration for configuring said plurality of filter elements to emulate a notch filter, comprising circuitry for causing said selector to select a portion of said plural filter elements, said portion comprising:

a second plurality of said filter elements selected to produce a first frequency response; and a third plurality of said filter elements selected to produce a second frequency response, higher than said first frequency response, so that a frequency gap is formed between said first and second frequency responses, thereby producing a notch filter overall frequency response.

2. The programmable filter bank of claim 1, wherein said plural filter elements are arranged in an ascending frequency sequence, further comprising:

a second controller configuration for configuring said plurality of filter elements to emulate a bandpass filter, comprising circuitry for causing said selector to select a portion of said plural filter elements, said portion comprising another plurality of said filter elements arranged in a contiguous frequency sequence to produce a bandpass filter overall frequency response.

3. The programmable filter bank of claim 1, wherein each of said plurality of filter elements is one of a quartz crystal filter, a ceramic resonator, and a dielectric resonator.

4. The programmable filter bank of claim 1, wherein the input signal is of predefined signal strength, further comprising an amplifier connected to said controller and to said plural filter elements for maintaining the output signal at a constant signal strength substantially equivalent to said predefined signal strength.

5. The programmable filter bank of claim 1, wherein each said filter element comprises a first lead and a second lead, and wherein said selector further comprises:

a plurality of column wires, wherein each of said plural column wires is connected to said first lead of at least one of said plural filter elements;

a plurality of row wires, positioned substantially perpendicular to said plural column wires, wherein each of said plural row wires is connected to said second lead of at least one of said plural filter elements so as to form a plurality of virtual intersections of said plural column wires and plural row wires, wherein each of said plural filter elements is positioned at, and connected to corresponding column and row wires at, one of said plural virtual intersections; and an activation controller, connected to said plurality of column wires and to said plurality of row wires, operable to selectively activate at least one column wire of said plurality of column wires and at least one row wire of said plurality of row wires to activate at least one filter element of said plurality of filter elements positioned at at least one virtual intersection of said plurality of virtual intersections corresponding to said activated at least one column wire and said activated at least one row wire.

6. The programmable filter bank of claim 5, wherein said activation controller further comprises:

a plurality of column switches, each of said plural column switches being connected to one of said plural column wires, and being operable to activate said one connected column wire of said plurality of column wires; and a plurality of row switches, each of said plural row switches being connected to one of said plural row wires, and being operable to activate said one connected row wire of said plurality of column wires.

7. The programmable filter bank of claim 6, further comprising:

a programmable state controller connected to said plurality of column switches and said plurality of row switches, and operable for selectively activating at least one of said plural column switches and at least one of said plural row switches so as to simultaneously activate one of a predefined plurality of filter element groups, each of said filter element groups comprising at least one filter element of said plurality of filter elements.

8. The programmable filter bank as in claim 6 wherein said activation controller comprises a plurality of row switches, each of said row switches is electrically connected to one of said rows of wires and a plurality of column switches and each of said column switches is electrically connected to one of said column switches wherein when one of said row switches is in an ON state, and one of said column switches is in an ON state, one of said filters is activated, wherein one or more filters are activated to control the overall frequency response.

9. The programmable filter bank as in claim 8 wherein the row switches are programmable.

10. The programmable filter bank as in claim 8 wherein the column switches are programmable.

11. The programmable filter bank of claim 1, wherein said selector further comprises:

a second controller for determining whether said selected at least one filter corresponds to one of a plurality of predefined illegal selections, and:

when said selected at least one filter is determined to not correspond to one of said plurality of predefined illegal selections, triggering said controller to apply said overall frequency response to said input signal, and when said selected at least one filter is determined to correspond to one of said plurality of predefined illegal selections, preventing said controller from applying said overall frequency response to said input signal.

* * * * *